United States Patent [19]
Bortolini et al.

[11] Patent Number: 5,473,640
[45] Date of Patent: Dec. 5, 1995

[54] PHASE-LOCK LOOP INITIALIZED BY A CALIBRATED OSCILLATOR-CONTROL VALUE

[75] Inventors: James R. Bortolini, Broomfield; Gary J. Grimes, Thornton, both of Colo.

[73] Assignee: AT&T Corp., Murray Hill, N.J.

[21] Appl. No.: 185,100

[22] Filed: Jan. 21, 1994

[51] Int. Cl.[6] .................................................. H03D 3/20
[52] U.S. Cl. ............................................ 375/376; 331/18
[58] Field of Search ................................... 375/108, 120; 331/18

[56] References Cited

U.S. PATENT DOCUMENTS

| | | | |
|---|---|---|---|
| 4,516,250 | 5/1985 | Grimes | 375/82 |
| 4,633,193 | 12/1986 | Scordo | 331/1 A |
| 4,703,520 | 10/1987 | Rozanski, Jr. et al. | 455/75 |
| 4,930,142 | 5/1990 | Whiting et al. | 375/120 |
| 4,972,442 | 11/1990 | Steierman | 375/108 |
| 4,980,899 | 12/1990 | Troost et al. | 375/108 |
| 5,028,885 | 7/1991 | Voigt et al. | 375/120 |
| 5,041,798 | 8/1991 | Moorman et al. | 331/1 A |

*Primary Examiner*—Stephen Chin
*Assistant Examiner*—T. Ghebretinsae
*Attorney, Agent, or Firm*—David Volejnicek

[57] ABSTRACT

A phase-lock loop (FIG. 1) is initialized at power-up by an oscillator (14) control signal (28) that has previously been stored by a processor (20) in a non-volatile memory (27). The stored control signal is generated by the phase-lock loop's controller (12) in response to receipt of a calibrated reference input signal, as part of manufacturing of the phase-lock loop and occasionally thereafter during normal operation. Being stored in non-volatile memory, the control signal is not lost upon removal of power from the phase-lock loop. The stored control signal is then used to control the oscillator instead of the controller's output upon power-up and until the later one of (a) receipt by the phase-lock loop of a valid reference signal and (b) receipt of a directive for the controller to take over control of the oscillator.

8 Claims, 3 Drawing Sheets

PHASE-LOCK LOOP INITIALIZED BY A CALIBRATED OSCILLATOR-CONTROL VALUE

TECHNICAL FIELD

This invention relates to phase-look loop circuits.

BACKGROUND OF THE INVENTION

Phase-look loops (also sometimes referred to as phase-looked loops) are well-known circuits. Conventionally used as a clock-frequency generator in telecommunications systems, a phase-look loop locally generates an output signal stream that is referenced to or looked to (i.e., that tracks) a remotely-supplied reference input signal stream, in both frequency and phase. Both analog and digital implementations of phase-look loops are well known.

The basic configuration of a phase-look loop includes an oscillator that generates the local output signal. The oscillator output is fed as an input to a phase comparator, along with the remote reference signal. Output of the phase comparator, which is representative of the frequency and phase difference of its two inputs, is fed to a controller that converts this difference signal into a control signal for the oscillator. Under influence of the control signal, the output of the oscillator is adjusted to track the remotely-supplied reference input signal.

Conventionally, upon power-up (start-up) of the phase-look loop and before it has had time to look onto the reference input signal, or upon loss of the reference input signal following the phase-look loop having looked thereunto, the phase-look loop has been operated in a "free running" mode. That is, the output signal generated by the phase-look loop has been the output of the oscillator operating free of any adjustment to its operation being made by the controller. For the output of the phase-look loop to be useful while "free running", it has been necessary to use a very precise and stable oscillator that could be depended upon to independently operate very precisely at the reference signal's frequency, and to not drift in frequency and phase over very long periods of time (e.g., years). However, such oscillators are very expensive.

To avoid the use of a very expensive oscillator yet still ensure that the phase-look loop output remains stable during temporary loss of the reference input signal, a capability known as "holdover" has been developed and is well-known in the art. This capability involves temporarily latching the control signal generated by the controller immediately prior to the loss of the reference input signal, and continuing to use the latched control signal to control the output of the oscillator during the time period when the reference input signal is not available. However, the "holdover" capability has done nothing to solve the problem of "free running" operation of a phase-lock loop with an inexpensive—imprecise and unstable—oscillator during power-up, and particularly during power-up in the absence of the reference input signal, because a "holdover" control signal is not available to the phase-look loop at power-up, and thereafter until the reference input signal becomes available. Consequently, the problems that result from operating a phase-lock loop with an imprecise and unstable oscillator have not been fully solved by the prior art.

SUMMARY OF THE INVENTION

This invention is directed to solving these and other problems and disadvantages of the prior art. Generally according to the invention, the phase-lock loop is initialized at power-up by an oscillator-control signal that has previously been stored in a non-volatile manner. Specifically according to the invention, in a phase-lock loop that comprises an oscillator for generating an output signal under influence of a control signal and an oscillator control coupled to the oscillator for generating the control signal under influence of a received reference signal, an arrangement is provided which responds to receipt by the oscillator control of a predetermined said reference signal (e.g., a calibrated reference signal) by storing the (calibrated) control signal, that is generated by the oscillator control under the influence of the predetermined reference signal, in a non-volatile manner (e.g., in a non-volatile memory). Then, upon a subsequent power-up of the phase-lock loop, the arrangement supplies the stored control signal to the oscillator to influence generation of the output signal at power-up instead of the control signal—if any—that is generated at power-up by the oscillator control.

With the use of the above-characterized arrangement, the operation of the phase-lock loop at power-up is no longer "free-running", but is controlled by an oscillator control signal as at other times during the operation of the phase-lock loop. Since the operation at power-up is controlled, the problems associated with operating a phase-lock loop with an inexpensive, imprecise and unstable, oscillator at power-up in "free running" mode are alleviated. By virtue of being stored in a non-volatile manner such that it is not affected by removal of power from the phase-lock loop, the control signal continues to exist and is available for controlling the oscillator at power-up. And since the stored control signal is not generated as a function of just any reference signal, but is generated only on the basis of a predetermined reference signal such as a calibrated reference signal, it is possible to ensure that the stored control signal is one that will yield the generation by the oscillator of a high-quality output signal typical of greatly more expensive oscillators.

Illustratively, the above-characterized arrangement is implemented as a digital processor operating under stored-program control. Such an implementation is simple to construct, and is readily modified for use in different environments and for different applications. And since many systems that make use of phase-lock loops already include digital processors with spare processing capacity that may be used for this purpose, this implementation adds little or no hardware and very little cost to the overall system.

These and other advantages and features of the invention will become more apparent from the following description of an illustrative embodiment of the invention taken together with the drawing.

DETAILED DESCRIPTION

Figure 1:
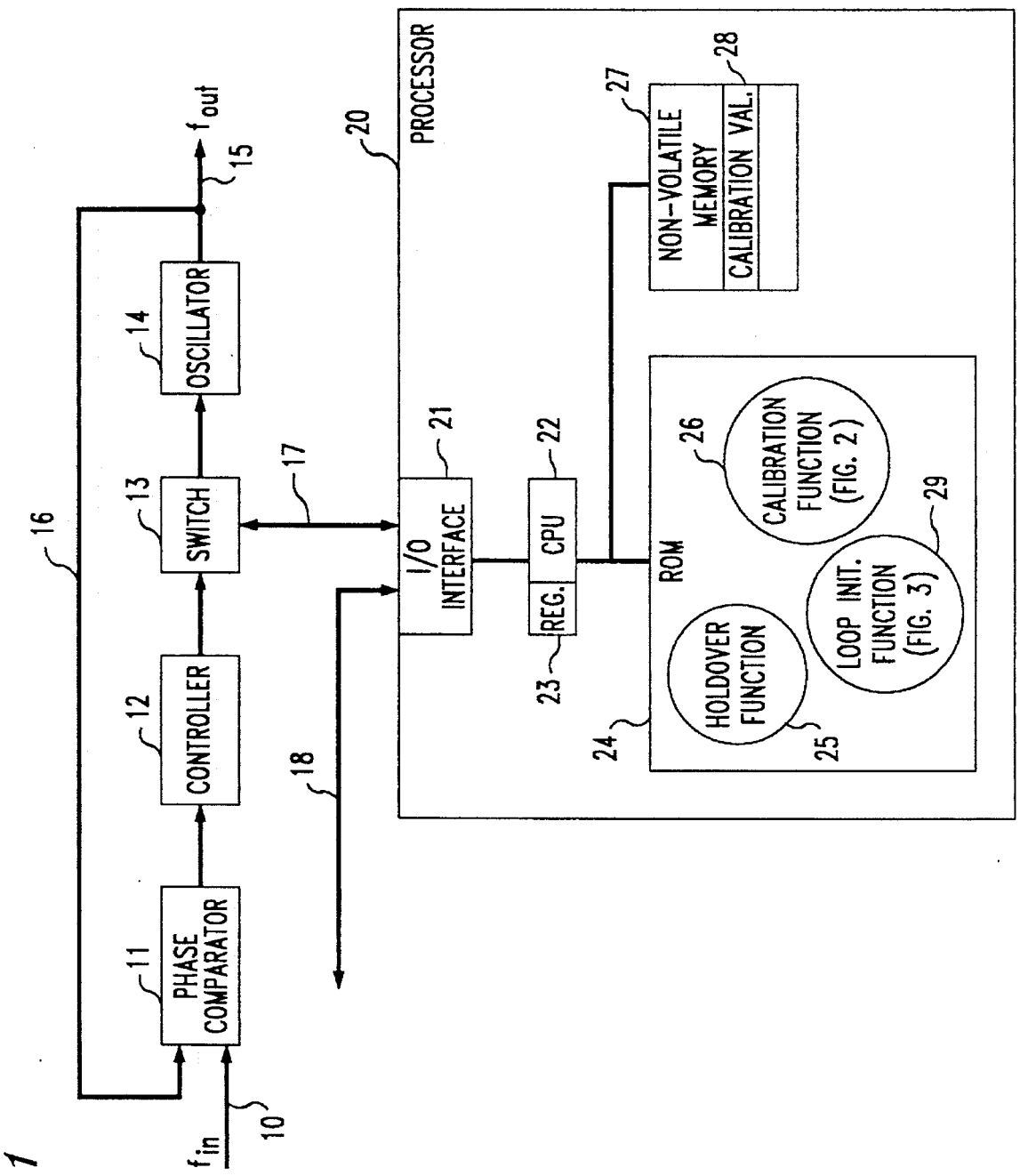
FIG. 1 is a block diagram of a phase-lock loop that incorporates an illustrative embodiment of the invention.

FIG. 1 shows a conventional phase-lock loop modified according to the present invention. The conventional phase-lock loop includes a phase comparator 11 that receives a locally-generated signal stream over a link 16, and a remotely-supplied reference signal stream $f_{in}$ over a link 10. Phase comparator determines the phase difference between the two received signals and supplies a signal indicative of that difference to a controller 12. This phase difference over a long period of time indicates a frequency difference between these two signals. Controller 12 converts the indicated difference into a control signal which it supplies to an oscillator 14 through a switch 13. Controller 12 illustratively comprises a low-pass filter. Oscillator 14 generates an output signal stream $f_{out}$ on a link 15, and it responds to the received control signal by adjusting the frequency and/or phase of output signal $f_{out}$ accordingly. Oscillator 14 illustratively comprises a voltage-controlled crystal oscillator or a digital frequency synthesizer. A sample of output signal $f_{out}$ is fed back to phase comparator 11 via link 16. The phase-lock loop of FIG. 1 may be either an analog or a digital phase-lock loop.

Switch 13 or a functional equivalent is conventionally used in conjunction with provisioning of the "holdover" function to provide a "holdover" control signal value in place of the output of controller 12 to oscillator 14 when $f_{in}$ is temporarily lost. According to the invention, switch 13 is used to couple a digital processor 20 to the phase-lock loop.

Processor 20 is illustratively any suitable conventional and commercially-available microprocessor. It comprises a central processing unit (CPU) 22 that includes at least one register 23 for temporarily storing a data item, a read-only memory (ROM) 24 that holds programs which CPU 22 executes, and a non-volatile memory 27 that is both readable and writable and that stores data for use by CPU 22 during program execution. The non-volatile nature of memory 27 ensures that data stored therein do not disappear therefrom when the phase-lock loop and processor 20 of FIG. 1 are unpowered, but rather ensures that the data are immediately available to processor 20 upon power-up. CPU 22 is connected to switch 13 through an input and output (I/O) interface 21 and a link 17. I/O interface 21 and a link 18 serve to also connect processor 20 to "the outside world", e.g., other circuitry of any system that the phase-lock loop of FIG. 1 is a part of.

Processor 20 performs the conventional "holdover" function by executing a holdover function program 25 out of ROM 24. While the phase-lock loop of FIG. 1 is powered up and operating, processor 20 is appraised via link 18 of the presence or absence of reference signal $f_{in}$ on link 10. While $f_{in}$ is present, processor 20 monitors the value of the oscillator control signal being generated by controller 12 via switch 13, and repeatedly stores the present value of this control signal in register 23. When $f_{in}$ becomes absent, processor 20 causes switch 13 to disconnect the output of controller 12 from the control input of oscillator 14, and instead processor 20 supplies the control signal value stored in register 23 to the control input of oscillator 14 via switch 13. When $f_{in}$ is restored, processor 20 ceases to supply the control-signal value from register 23 to oscillator 14, causes switch 13 to reconnect the output of controller 12 to oscillator 14, and resumes repeatedly storing in register 23 the present value of the control signal being generated by controller 12.

In addition to the holdover function, processor 20 performs a calibration function 26 and a related loop initialization function 29.

Figure 2:
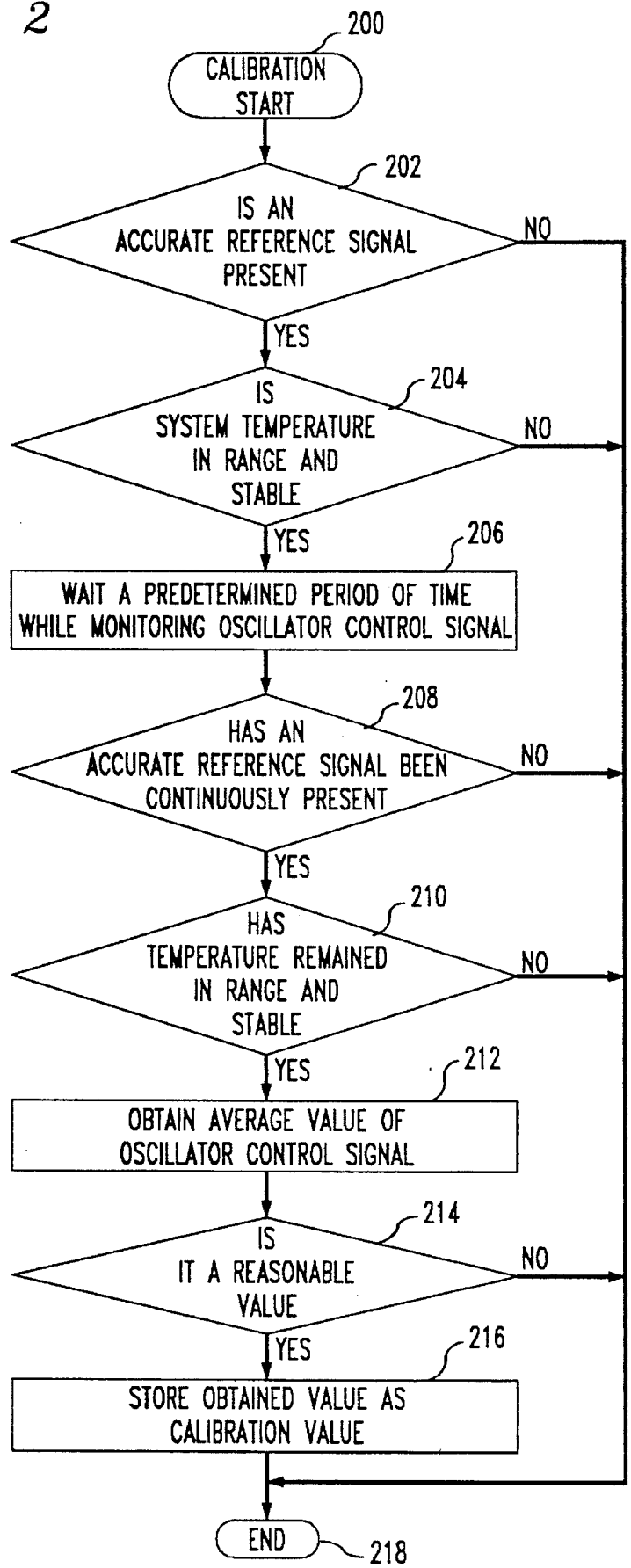
FIG. 2 is a functional flow diagram of a calibration function of the processor of the phase-lock loop of FIG. 1.

Normally, calibration function 26 will initially be performed before a system of which the phase-lock loop and processor 20 of FIG. 1 are a part is placed into service, e.g., as pan of the final stage of manufacturing the system. A source of accurate reference signal $f_{in}$ (i.e., a calibrated source) is connected to link 10, the system is powered up, and a phase-lock command accompanied by a calibration command is issued to processor 20, illustratively via link 18. In response to receipt of the calibration command, processor 20 executes calibration function 26, which is flowcharted in FIG. 2.

Upon receipt of the calibration command, at step 200, processor 20 checks whether an accurate reference signal is present, at step 202. How this determination is made will vary from system to system. For example, in a telephony transmissions system operating under the Synchronous Digital Hierarchy (SDH) standard, processor 20 checks for receipt by the system of a synchronization status message byte (SSMB) informing the system that the incoming $f_{in}$ is created by a primary clock source. An alternative check may involve receipt by processor 20 via link 18 of a command manually entered by a craftsperson, which either informs processor 20 that a calibrated source of $f_{in}$ is connected to link 10 or which causes processor 20 to skip the check of step 202.

If it is not determined at step 202 that accurate reference signal $f_{in}$ is present, processor 20 terminates calibration function 26, at step 218. If it determined at step 202 that accurate reference signal $f_{in}$ is present or if the step is omitted, processor 20 checks whether the system's ambient temperature is in a predefined range and is stable, at step 204. Illustratively, processor 20 obtains this information by querying other units of the system of which the phase-lock loop and processor 20 are a part. The reason for the check is to ensure that the performance of oscillator 14 is not being unduly affected by temperature. If oscillator 14 is immune to system temperature (for example, if oscillator 14 is an ovenized or a temperature-compensated oscillator), then the check of step 204 may be omitted.

If it is determined at step 204 that system temperature is not in range and stable, processor 20 terminates calibration function 26, at step 218. If it is determined at step 204 that system temperature is in range and stable or if the step is omitted, processor 20 commences to monitor the oscillator control signal being generated by controller 12 and does so for a predetermined period of time referred to as the calibration interval, at step 206, to ensure that the phase-lock loop has had sufficient opportunity to lock onto the reference signal $f_{in}$. Processor 20 then repeats the checks of steps 202 and 204, at steps 208 and 210, respectively, to ensure that the requisite conditions for proper calibration have continued to exist throughout the calibration interval. These checks may likewise be omitted based on the same criteria as were discussed in conjunction with steps 202 and 204.

If the requisite conditions continued to exist, processor 20 obtains the average value of the oscillator control signals generated by controller 12 and monitored during the calibration interval, at step 212. Processor 20 then checks whether this average value is reasonable, at step 214. Illustratively, processor 20 performs this check by comparing the average control value against a presently-stored calibration value 28 retrieved from non-volatile memory 27 to determine whether the average control value is within a predetermined range of the presently-stored calibration value 28; if there is no presently-stored calibration value 28, processor 20 merely accepts the average control value as being reasonable. If processor 20 finds at step 214 that the average control value is not reasonable, it terminates calibration function 26, at step 218. If processor 20 finds at step 214 that the average control value is reasonable, it stores the average control value as calibration value 28 in non-volatile memory 27, along with a time-stamp that indicates the date and time of creation of the calibration value, at step 216, and then terminates calibration function 26, at step 218.

Figure 3:
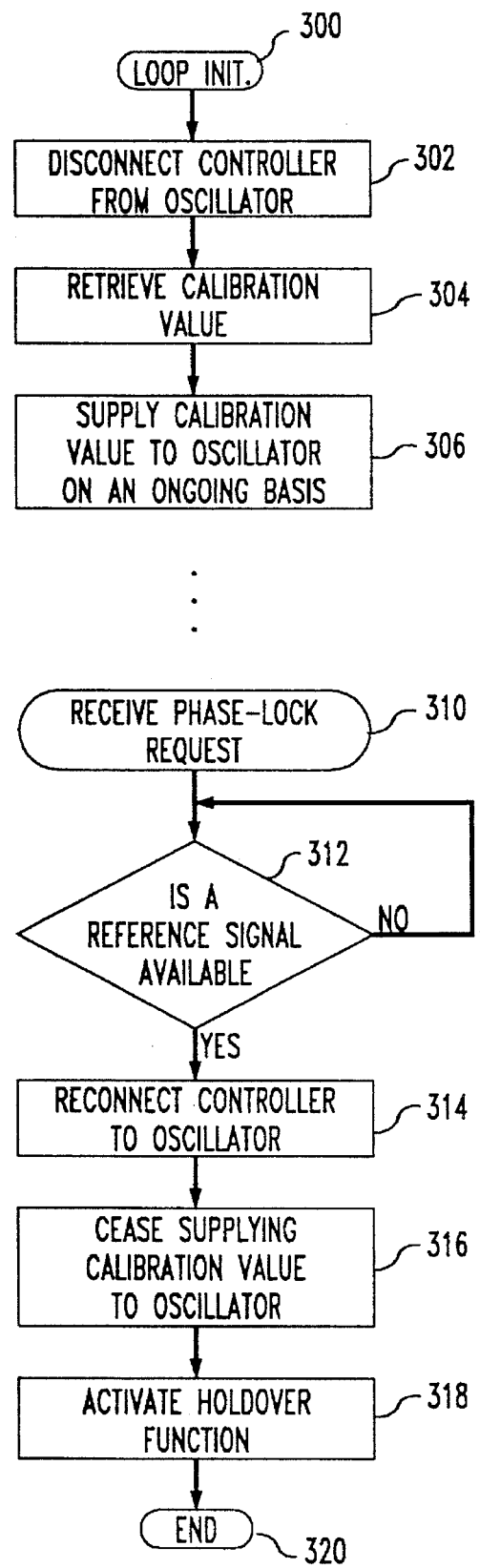
FIG. 3 is a functional flow diagram of a loop initialization function of the processor of the phase-lock loop of FIG. 1.

Processor 20 may now be unpowered, along with the rest of the system of which it is a pan. Due to the non-volatile nature of memory 27, calibration value 28 is not lost, but remains available to processor 20 upon subsequent power-up of processor 20. Upon that subsequent power-up, e.g., upon the system of which the phase-lock loop and processor 20 are a pan being placed in, or being returned to, service, processor 20 executes loop initialization function 29, which is flowcharted in FIG. 3.

In response to invocation of loop initialization function 29, at step 300, processor 20 causes switch 13 to disconnect the control output of controller 12 from the control input of oscillator 14, at step 302. Processor 20 retrieves the previously-stored calibration value 28 from non-volatile memory 27, at step 304, and supplies this value 28 to the control input of oscillator 14 on an ongoing basis, at step 306, in place of any control signal that may be generated by controller 12 at this time. This causes oscillator 14 to generate an output signal stream $f_{out}$ that is the same in both frequency and phase as what oscillator 14 generated when the phase-lock loop of FIG. 1 was last calibrated with an accurate reference signal $f_{in}$.

When processor 20 receives via link 18 a directive to allow controller 12 to take over control of oscillator 14 and lock the output $f_{out}$ of the phase-lock loop to the input $f_{in}$, at step 310, it first checks whether $f_{in}$ is presently available, at step 312. Illustratively, processor 20 performs this check by interrogating other circuitry of the system of which the phase-lock loop and processor 20 are a part, via link 18. If processor 20 determines at step 312 that $f_{in}$ is not available, it continues the present mode of operation while it waits at step 312 for $f_{in}$ to become available. If and when processor 20 determines at step 312 that $f_{in}$ is available, processor 20 causes switch 13 to reconnect the control output of controller 12 to the control input of oscillator 14, at step 314, thereby putting oscillator 14 under control of controller 12, and ceases to supply calibration value 28 to oscillator 14, at step 316. Processor 20 then activates execution of holdover function 25, at step 318, and ends, at step 320. The operation of the phase-lock loop of FIG. 1 becomes conventional at this point.

Conventional commercial-grade oscillators have an inherent instability in their operational characteristics that manifests itself as drift in their output phase and frequency over time. To ensure that calibration value 28 reflects the present operational characteristics of oscillator 14, calibration function 26 must occasionally be re-executed. Re-execution may be triggered periodically automatically, such as whenever the time stamp that accompanies calibration value 28 indicates that value 28 has exceeded a predetermined age. Or, it may occur every time that processor 20 receives an indication that accurate (calibrated) reference signal $f_{in}$ is present on line 10. Also, it may be triggered manually, in response to receipt by processor 20 of a command entered by a craftsperson.

The manual-trigger mechanism facilitates use of a system of which the phase-lock loop and processor 20 of FIG. 1 are a part in areas where accurate reference signal $f_{in}$—or even any reference signal $f_{in}$—is not available. In such areas, a craftsperson periodically arrives carrying a portable calibrated source of accurate reference signal $f_{in}$, connects this source to link 10, and manually commands processor 20 to execute calibration function 26. Following its execution, the craftsperson disconnects the portable calibrated source from link 10, leaving the system to run without accurate reference signal input until the next time that the craftsperson returns.

Of course, various changes and modifications to the illustrative embodiment described above will be apparent to those skilled in the art. For example, calibration value 28 may be used by processor 20 to evaluate the accuracy of $f_{in}$ or to detect problems in the operation of the phase-lock loop, by periodically comparing the present value of the control signal being generated by controller 12 with calibration value 28 and raising an alarm when the two compared values deviate from each other by more than a predetermined amount. Also, the controller function of the phase-lock loop need not be a separate element, but may be implemented as a pan of the processor. Furthermore, other constraints may be imposed on when calibration is allowed to be performed, such as presence of a reference of a particular quality (strata) or higher, input signal noise (jitter, wander) amplitude, and power stability. Further still, a number of previously-calculated calibration values may be stored and used as a part of the computation of a new calibration value (using, for example, a weighted optimal estimation technique). Or, the calibration value need not be a computed or an average value, but may be a present value of the oscillator control signal. Such changes and modifications can be made without departing from the spirit and the scope of the invention and without diminishing its attendant advantages. It is therefore intended that such changes and modifications be covered by the following claims.

We claim:

1. A phase-lock loop comprising:

oscillator means for generating an output signal under influence of a control signal;

oscillator control means coupled to the oscillator means for generating the control signal under influence of a received reference signal;

means responsive to receipt by the oscillator control means of a predetermined said reference signal for storing the control signal, generated by the oscillator control means under the influence of the predetermined reference signal, in a non-volatile manner; and means responsive to power-up of the phase-lock loop, for supplying the stored control signal to the oscillator means to influence generation of the output signal at power-up instead of any said control signal that is generated at power-up by the oscillator control means.

2. The phase-lock loop of claim 1 wherein:

the supplying means are responsive to the power-up for supplying the stored control signal to the oscillator means from power-up until a later-occurring one of (a) receipt by the oscillator control means of a reference signal and (b) receipt of an indication that the oscillator control means is to start controlling the output of the oscillator means.

3. The phase-lock loop of claim 1 wherein:

the storing means comprise
non-volatile memory means, and
means for selectively storing the control signal generated by the oscillator control means in the non-volatile memory means; and the supplying means comprise
switching means for selectively connecting and disconnecting the control signal generated by the oscillator control means to and from the oscillator means, and
means for retrieving the storm control signal from the non-volatile memory means and supplying the retrieved control signal to the oscillator means while the oscillator control means is disconnected by the switching means from the oscillator means.

4. The phase-lock loop of claim 3 wherein:

the means for selectively storing and the means for retrieving and supplying comprise
a digital processor operating under stored program control.

5. A phase-lock loop comprising:

an oscillator for generating an output signal under influence of a control signal;

a controller for generating the control signal in accordance with a phase difference signal;

a phase comparator for comparing a phase of a received reference signal with a phase of the output signal and generating the phase difference signal that is representative of their phase difference;

means for supplying a calibrated said control signal to the oscillator at power-up of the phase-lock loop; and switching means interposed between the controller, the oscillator, and the supplying means for selectively connecting the control signal generated by the controller to both the oscillator and the supplying means and selectively connecting the calibrated control signal to the oscillator in place of the control signal generated by the controller;

the means for supplying comprising
a non-volatile memory,
means for causing the switching means to connect the control signal generated by the controller to both the oscillator and the supplying means and responsive to receipt by the phase-comparator of a predetermined said reference signal for storing the control signal, that is generated by the controller in accordance with a phase difference signal representative of the phase difference of the output signal and the predetermined reference signal, in the non-volatile memory as the calibrated control signal, and
means responsive to power-up of the phase-lock loop for retrieving the calibrated control signal from the non-volatile memory and causing the switching means to connect the retrieved calibrated control signal to the oscillator in place of any control signal generated by the controller.

6. The phase-lock loop of claim 5 wherein:

the retrieving and causing means comprise
means responsive, following power-up, to a later-occurring one of (a) receipt by the phase comparator of a reference signal and (b) receipt of an indication that the controller is to start controlling the oscillator, for causing the switching means to cease connecting the calibrated control signal to the oscillator in place of the control signal generated by the controller and to connect to the oscillator the control signal generated by the controller.

7. The phase-lock loop of claim 6 wherein:

the means for supplying the calibrated control signal comprise
a digital processor operating under stored program control.

8. A method of operating a phase-lock loop comprising an oscillator for generating an output signal under influence of a control signal and an oscillator control coupled to the oscillator for generating the control signal under influence of a received reference signal, comprising the steps of:

in response to receipt by the oscillator control of a predetermined said reference signal, storing the control signal, generated by the oscillator control under the influence of the predetermined reference signal, in a non-volatile manner; and in response to power-up of the phase-lock loop, supplying the stored control signal to the oscillator to influence generation of the output signal at power-up instead of any said control signal that is generated at power-up by the oscillator control.

* * * * *